(12) United States Patent
Gao

(10) Patent No.: US 12,082,380 B2
(45) Date of Patent: Sep. 3, 2024

(54) PREFABRICATED MODULE FOR HETEROGENEOUS DATA CENTERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 45 days.

(21) Appl. No.: 17/644,890

(22) Filed: Dec. 17, 2021

(65) Prior Publication Data

US 2023/0200025 A1    Jun. 22, 2023

(51) Int. Cl.
*H05K 7/20* (2006.01)
*G06F 1/20* (2006.01)
*H05K 7/14* (2006.01)

(52) U.S. Cl.
CPC ............ *H05K 7/208* (2013.01); *G06F 1/20* (2013.01); *H05K 7/1489* (2013.01); *H05K 7/1492* (2013.01); *H05K 7/20272* (2013.01); *H05K 7/203* (2013.01); *H05K 7/20318* (2013.01); *H05K 7/20327* (2013.01); *H05K 7/20745* (2013.01); *H05K 7/20781* (2013.01); *H05K 7/2079* (2013.01); *H05K 7/20818* (2013.01)

(58) Field of Classification Search
CPC ...... H05K 7/20; H05K 7/203; H05K 7/20236; H05K 7/20318; H05K 7/20327; H05K 7/20554; H05K 7/20563; H05K 7/20572; H05K 7/20627; H05K 7/20636; H05K 7/20645; H05K 7/20663; H05K 7/20672; H05K 7/20681; H05K 7/20709; H05K 7/20718; H05K 7/20727; H05K 7/20736; H05K 7/20763; H05K 7/20772; H05K 7/20781; H05K 7/208; H05K 7/20809; H05K 7/20818; H05K 7/20836; H05K 7/20827; H05K 7/1489; H05K 7/1492; H05K 7/20581; H05K 7/2059; H05K 7/206; H05K 7/20609; H05K 7/20618; H05K 7/20145; H05K 7/202; H05K 7/20218; H05K 7/20254; H05K 7/20754; H05K 7/20745; H05K 7/2079; G06F 1/20
See application file for complete search history.

(56) References Cited

U.S. PATENT DOCUMENTS 8,031,468 B2 * 10/2011 Bean, Jr. ............ F28D 15/0266
                                                         361/679.48
9,313,920 B2 *  4/2016 Campbell ................ F28B 3/04
(Continued)

*Primary Examiner* — Adrian S Wilson
*Assistant Examiner* — Gage Crum
(74) *Attorney, Agent, or Firm* — WOMBLE BOND DICKINSON (US) LLP

(57) ABSTRACT

Systems and methods to provide a prefabricated module design for heterogeneous data centers are described. An apparatus to provide cooling for an electronic rack of a data center comprises a plurality of lines. A main chassis is coupled to the plurality of lines. The main chassis is configured to be integrated on the electronic rack. An extension chassis is coupled to the main chassis. The extension chassis is configured to move relative to the main chassis. A plurality of connection ports are coupled to the extension chassis to provide connections between the electronic rack and one or more external sources. The plurality of connection ports are configured to move relative to the plurality of lines that are at fixed locations on the electronic rack.

18 Claims, 13 Drawing Sheets

(56) References Cited

U.S. PATENT DOCUMENTS

| | | | |
|---|---|---|---|
| 9,648,784 B2* | 5/2017 | Keisling | H05K 5/02 |
| 10,426,057 B2* | 9/2019 | Jesionowski | G11B 15/68 |
| 10,448,543 B2* | 10/2019 | Farshchian | G06F 1/20 |
| 2004/0008483 A1* | 1/2004 | Cheon | G06F 1/20 |
| | | | 361/699 |
| 2004/0114326 A1* | 6/2004 | Dodgen | H05K 7/206 |
| | | | 361/696 |
| 2004/0221604 A1* | 11/2004 | Ota | H05K 7/20781 |
| | | | 361/691 |
| 2011/0313576 A1* | 12/2011 | Nicewonger | H05K 7/20781 |
| | | | 361/701 |
| 2012/0300391 A1* | 11/2012 | Keisling | H05K 7/20736 |
| | | | 211/26 |
| 2013/0025818 A1* | 1/2013 | Lyon | H05K 7/20781 |
| | | | 165/181 |
| 2016/0135323 A1* | 5/2016 | Haroun | H05K 7/1488 |
| | | | 361/679.53 |
| 2019/0124786 A1* | 4/2019 | Alonso | H02B 1/565 |
| 2021/0385978 A1* | 12/2021 | Shao | H05K 7/1489 |
| 2022/0192057 A1* | 6/2022 | Todoroki | F24F 1/0018 |
| 2022/0225527 A1* | 7/2022 | Chen | H05K 7/20327 |

* cited by examiner

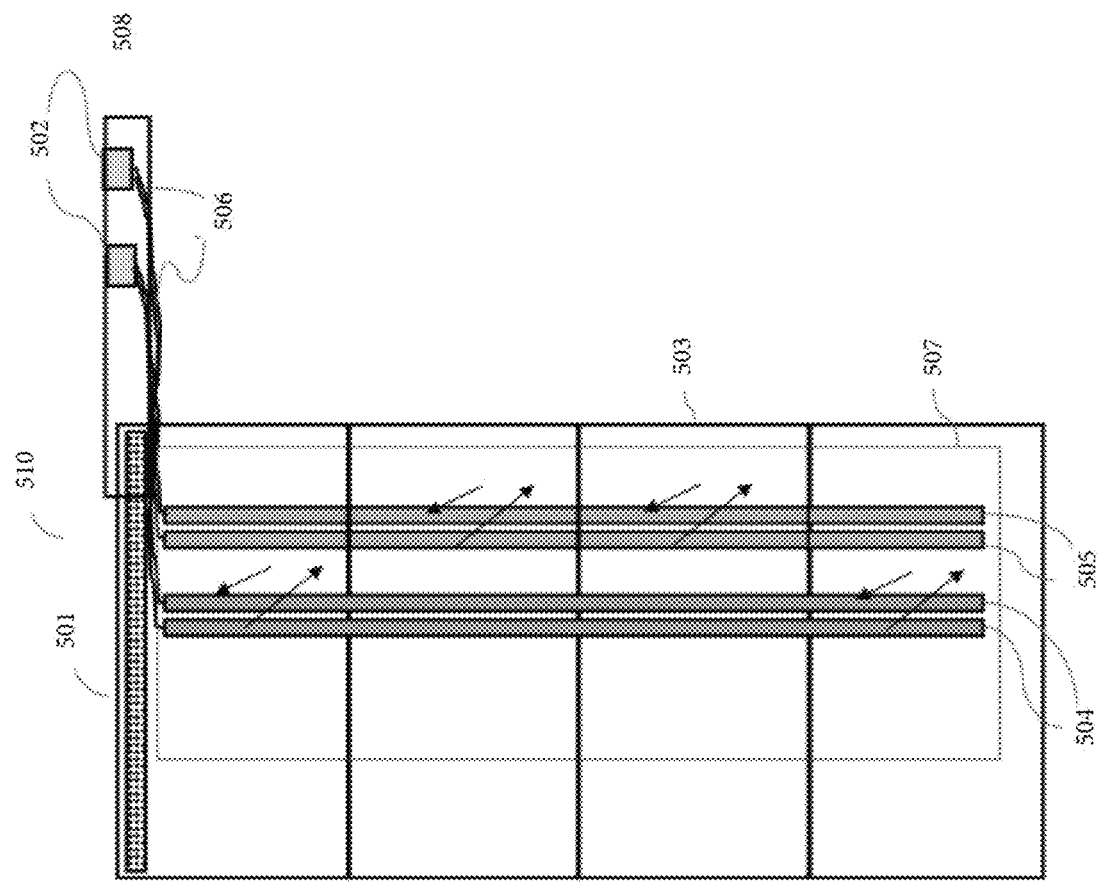
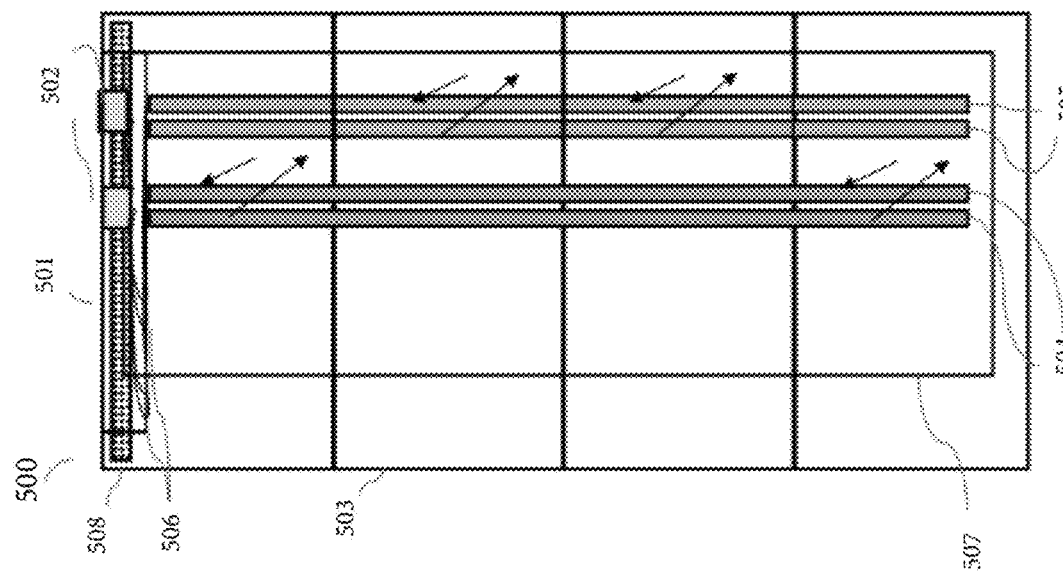
FIG. 5A
FIG. 5B

PREFABRICATED MODULE FOR HETEROGENEOUS DATA CENTERS

FIELD

Embodiments of the present disclosure relate generally to data center cooling. More particularly, embodiments of the disclosure relate to a heterogeneous cooling system for data centers.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

The conventional cooling solutions for designing modular clusters do not consider different fluid systems and different cluster requirements. In addition, the conventional solutions may not be used for accommodating different information technology (IT) clusters to coexist together.

BRIEF DESCRIPTION OF THE DRAWINGS

The appended drawings illustrate examples and are, therefore, exemplary embodiments and not considered to be limiting in scope.

FIG. 5A shows a top view of an apparatus on an electronic rack according to one embodiment.

FIG. 5B shows a top view of an apparatus on an electronic rack according to one embodiment.

DETAILED DESCRIPTION

Figure 1B:
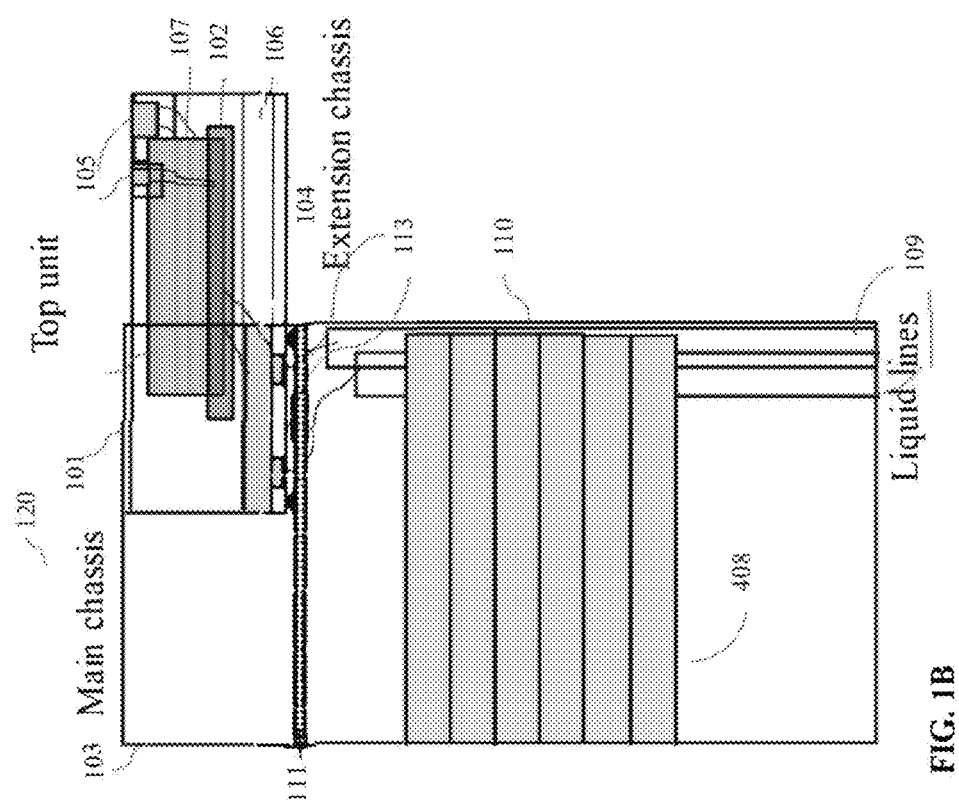
FIG. 1B shows a view of a cooling apparatus on an electronic rack of a data center according to one embodiment.

Systems and methods to provide a prefabricated module design for heterogeneous data centers are described. An advanced modular design is used to manufacture a highly prefabricated system to configure different heterogeneous information technology (IT) clusters. The term "heterogeneous" as described in the application indicates that different types of IT configurations and cooling systems coexist in one cluster.

In at least one embodiment, an apparatus to provide cooling for an electronic rack of a data center comprises a plurality of lines. A main chassis is coupled to the plurality of lines. The main chassis is configured to be fixed on the electronic rack. An extension chassis is coupled to the main chassis. The extension chassis is configured to move relative to the main chassis. A plurality of connection ports are coupled to the extension chassis to provide connections between the electronic rack and one or more external sources. The plurality of connection ports are configured to move relative to the plurality of lines that are at fixed locations on the electronic rack.

In at least some embodiments, a cooling device for an electronic rack of a data center includes a cooler and a collector coupled to the cooler and a plurality of fluid lines are coupled to the collector. A main chassis is coupled to the plurality of fluid lines that is configured to be fixed on the electronic rack. An extension chassis is coupled to the main chassis that is configured to move relative to the main chassis. A plurality of fluid connection ports are coupled to the extension chassis to provide fluid connections between the electronic rack and one or more external sources. The plurality of fluid connection ports are configured to move relative to the plurality of fluid lines that are at fixed locations on the electronic rack.

In at least some embodiments, a cooling system for a data center includes a plurality of electronic racks including a first cooling device on a first electronic rack; and a second cooling device on a second electronic rack. The first cooling device comprises a cooler and a collector coupled to the cooler. A plurality of lines are coupled to the collector. A main chassis is coupled to the plurality of lines. The main chassis is configured to be fixed on the first electronic rack. An extension chassis is coupled to the main chassis that is configured to move relative to the main chassis. A plurality of connection ports are coupled to the extension chassis to provide connections between the first electronic rack and one or more external sources. At least one of the cooler or the collector are within the extension chassis to extend outside the first electronic rack to connect to the second cooling device to provide a containment region.

In at least one embodiment, the cooling apparatuses are designed for rows of electronic racks. In at least one embodiment, a cooling apparatus is designed to be on a top of an electronic rack. The cooling apparatus is used to enable fluid connections between an individual electronic rack and external sources. The cooling apparatus includes fluid lines and fluid connection ports. The cooling apparatus also includes a vapor collector and a cooler on a top of the vapor collector. The cooler is used for cooling an airflow and/or a vapor flow. In at least some embodiment, the cooler is a part of an air-to-liquid heat exchanger. The cooling apparatus includes a main chassis and an extension chassis. The main chassis is at fixed locations on the electronic rack. The extension chassis is extended during normal operation. The fluid lines are fixed at the main chassis during the operation, as described in further detail below.

In at least some embodiments, a modular and prefabricated architecture for a data center cluster is used for deploying heterogeneous IT systems. At least some embodiments of the disclosure provide a high efficiency cooling system architecture for design and deployment of heterogeneous information technology (IT) clusters. At least some embodiments of the disclosure provide a hyperscale heterogeneous data center cooling system. At least some embodiments of the disclosure provide an efficient facility side design with containment solution integration. At least some embodiments of the disclosure provide a co-design of the facility and an IT container. At least some embodiments of the disclosure provide an integration of different cooling technologies. Embodiments of the heterogeneous prefabricated module design provide high reliability, fast design, fabricate, build and deployment and scalable solution for different use cases. At least some embodiments of the disclosure enable different containment designs. At least some embodiments of the disclosure provide a highly integrated architecture and enable coexisting of different IT systems. At least some embodiments of the disclosure provide different types of servers coexisting in one cluster. At least some embodiments of the disclosure accommodate repaid changing of the systems, as described in further detail below.

Various embodiments and aspects of the present disclosure will be described with reference to details discussed below, and the accompanying drawings will illustrate various embodiments. The following description and drawings are illustrative of the disclosure and are not to be construed as limiting. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Figure 1A:
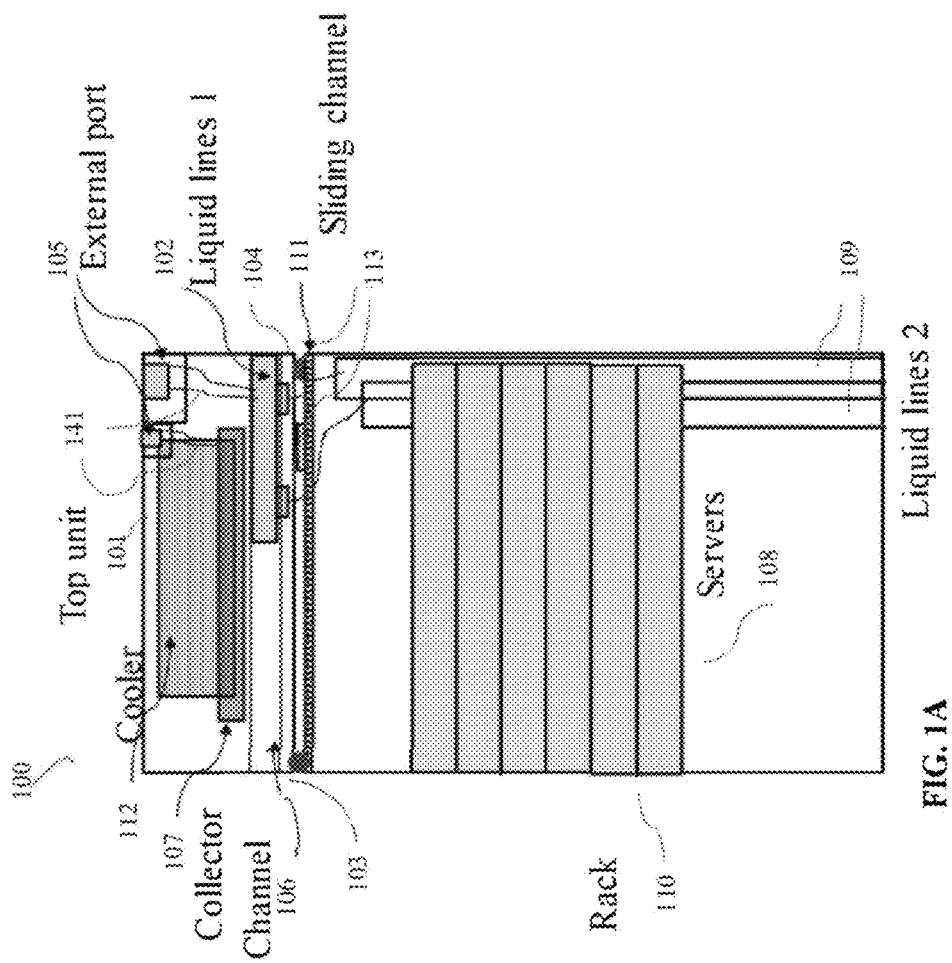
FIG. 1A shows a view of a cooling apparatus on an electronic rack of a data center according to one embodiment.

FIG. 1A shows a view 100 of a cooling device (apparatus) 101 on an electronic rack 110 of a data center according to one embodiment. As shown in FIG. 1A, cooling apparatus 101 includes a plurality of lines 102, a main chassis 103, an extension chassis 104 and a plurality of connection ports 105. In at least some embodiments, the plurality of lines 102 include fluid lines, power lines, or both the power lines and the fluid lines to connect to corresponding lines of the electronic rack 110. A main chassis 103 is coupled to the plurality of lines 102. In at least some embodiments, the plurality of lines are within the main chassis 103, as shown in FIG. 1A. The main chassis 103 is at fixed locations 113 on the electronic rack 110, as shown in FIG. 1A. An extension chassis 104 is coupled to the main chassis 103. The extension chassis 104 is movable relative to the main chassis 103. As shown in FIG. 1A, a plurality of connection ports 105 are coupled to the extension chassis 104. The connection ports 105 are used to provide connections between the electronic rack 110 and one or more external sources (not shown). The plurality of connection ports 105 are configured to move relative to the plurality of lines 102 that are at fixed locations 113 on the electronic rack.

FIG. 1B shows a view 120 of a cooling apparatus 101 on an electronic rack 110 of a data center according to one embodiment. The view 120 is different from view 100 in that the extension chassis 104 is moved relative to the main chassis 103, so that connection ports 105 are moved relative to the plurality of lines 102 that are at fixed locations 113 on the electronic rack 110. As shown in FIGS. 1A and 1B, electronic rack 110 includes one or more server chassis 108 that are inserted into server slots of electronic rack 110. The electronic rack 110 includes lines 109. In at least some embodiments, the lines 109 include electronic rack liquid lines, power lines, or both the power lines and the fluid lines to connect to corresponding lines 102. The cooling apparatus 101 includes a collector 107 coupled to the lines 102 and a cooler 112. As shown in FIGS. 1A and 1B, cooler 112 is placed on a top of collector 107. In at least some embodiments, collector 107 is used to collect and/or condense vapor generated from the liquid that passes through the server rack lines back to liquid. As shown in FIGS. 1A and 1B, the apparatus 101 includes a channel 106 that connects the extension chassis 104 to the main chassis 103. In at least some embodiments, the extension chassis 104 includes channel 106 to connect to the main chassis 103. As shown in FIGS. 1A and 1B, the cooling apparatus 101 includes one or more sliding channels 111 coupled to the channel 106. The connection ports 105 are connected to the plurality of lines 101 via flexible connectors 141—e.g., hoses, or other flexible connectors. In at least some embodiments, the connection ports 105 are fluid connection ports, power connection ports, or both the fluid connection ports and the power connection ports.

As shown in FIGS. 1A and 1B, the cooling apparatus 101 is integrated on the electronic rack 110. In at least some embodiments, a package (housing) of the cooling apparatus 101 is a top unit (module) on the electronic rack 110. FIG. 1A shows the cooling apparatus 101 at an initial location. At the initial location the cooling apparatus 101 is aligned with the electronic rack 110. FIG. 1B shows the cooling apparatus 101 at an extended position. At the extended position, a portion of the cooling apparatus on the extension chassis 104 is extended to overhang outside the electronic rack 110. In at least some embodiments, cooling apparatus 101 includes liquid lines, such as lines 102 and a cooler, such as cooler 112. The liquid lines 102 are used to connect one or more rack liquid lines 109 and an external cooling source (not shown). The liquid lines 102 are connected to the external cooling source through the corresponding connection ports 105. As shown in FIGS. 1A and 1B cooler 112 is on top of the collector 107. The collector 112 may provide multiple functions for various applications. In at least some embodiments, the collector collects a liquid that is condensed from a vapor. In at least some embodiments, the collector collects any leaked cooling fluid. In at least one embodiment, the collector acts as a protector that provides a segregation between the rack and the cooling recirculation on top of the racks.

In at least some embodiments, the main chassis 103 is fixed on top of the rack 110 and the liquid lines 102 are fixed within the main chassis 103. The extension chassis 104 is movable to extend outside of the electronic rack 110 at different lengths. The extension chassis 104 is connected to the main chassis 103 through the channel 106 and there are sliding channels 111 in between. When the cooling apparatus 101 is extended to outside of the rack 110, the cooler 112 and the collector 107 are also extended outside of the rack 110.

In at least some embodiments, the connections between the racks, such as electronic rack 110 and the liquid lines, such as lines 102 are fixed during the prefabrication process. The only moving loops are the ones between the external ports, such as connection ports 105 and the liquid lines. In an embodiment, the cooler 112 is connected to one external fluid source and the liquid lines 102 are connected to another external fluid source. In at least some embodiments, the plurality of lines 102 are fluid lines and comprise a single phase fluid lines, a two phase fluid lines, or both the single phase fluid lines and the two phase fluid lines to support different cooling systems of the electronic racks. In at least some embodiments, at least one of the cooler 112, the collector 107 are within the extension chassis 104 to extend outside the electronic rack to provide a containment region with another cooling device, as described in further detail with respect to FIG. 1C.

Figure 1C:
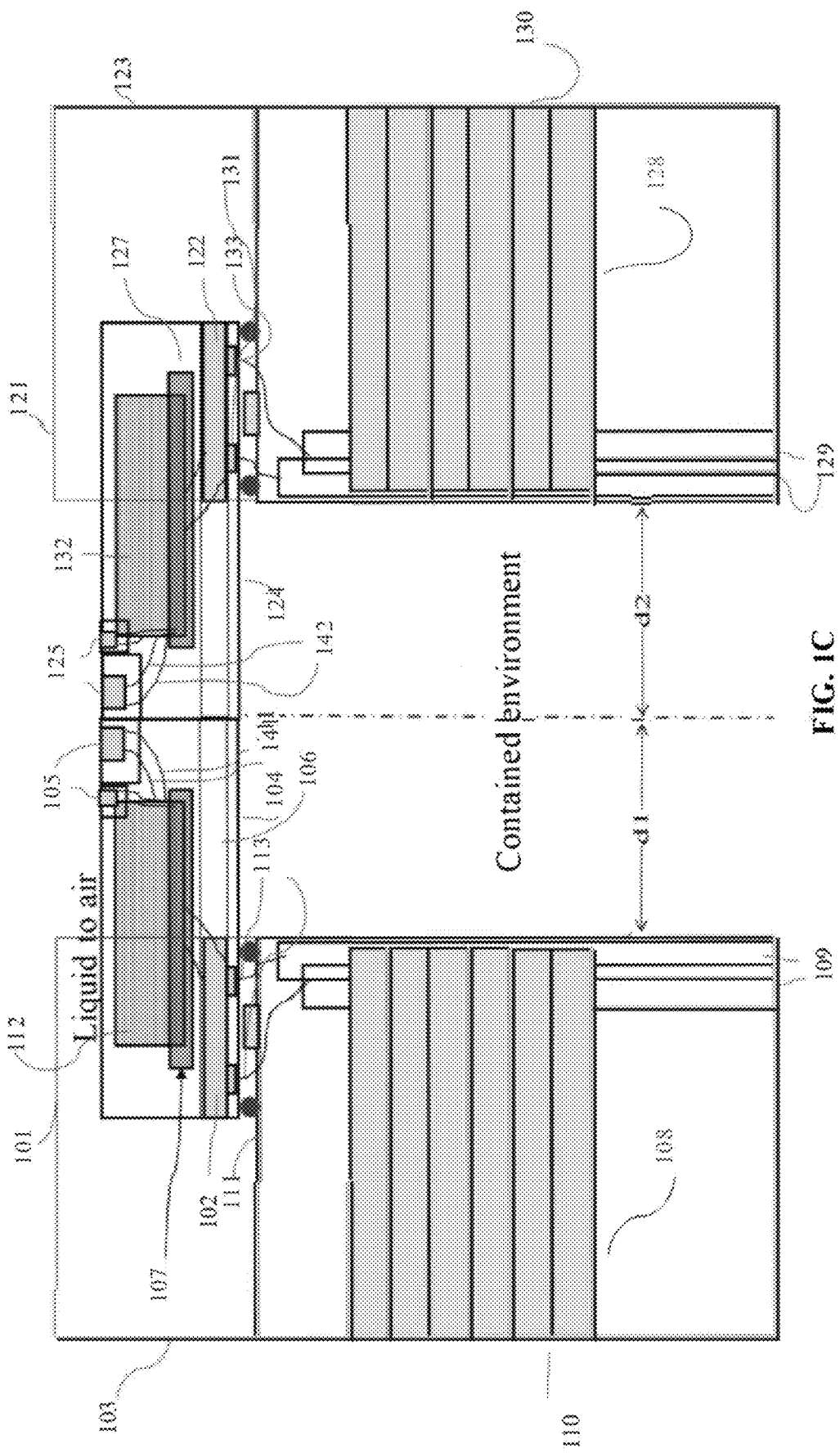
FIG. 1C shows a view of cooling apparatuses on electronic racks of a data center operated to provide a contained region according to one embodiment.

FIG. 1C shows a view 140 of cooling apparatuses on electronic racks of a data center to provide a containment region according to one embodiment. In at least some embodiments, view 140 represents a front view of two rows of the IT clusters with the cooling apparatuses 101 and 121 extended and aligned. As shown in FIG. 1C, cooling apparatus 121 includes a plurality of lines 122, a main chassis 123, an extension chassis 124 and a plurality of connection ports 125. In at least some embodiments, the plurality of lines 122 include fluid lines, power lines, or both the power lines and the fluid lines to connect to corresponding lines of an electronic rack 130. A main chassis 123 is coupled to the plurality of lines 122. In at least some embodiments, the plurality of lines are within the main chassis 123, as shown in FIG. 1C. The main chassis 123 is at fixed locations 133 on the electronic rack 130, as shown in FIG. 1C. An extension chassis 124 is coupled to the main chassis 123. The extension chassis 124 is movable relative to the main chassis 123. As shown in FIG. 1C, a plurality of connection ports 125 are coupled to the extension chassis 124. The connection ports 125 are used to provide connections between the electronic rack 130 and one or more external sources (not shown). The plurality of connection ports 125 are configured to move relative to the plurality of lines 122 that are at fixed locations 133 on the electronic rack 130.

As shown in FIG. 1C the extension chassis 104 is moved relative to the main chassis 103, so that connection ports 105 are moved relative to the plurality of lines 102 that are at fixed locations 113 on the electronic rack 110. The extension chassis 124 is moved relative to the main chassis 123, so that connection ports 125 are moved relative to the plurality of lines 122 that are at fixed locations 133 on the electronic rack 130.

As shown in FIG. 1C, electronic rack 130 includes one or more server chassis 128 that are inserted into server slots of electronic rack 130. The electronic rack 130 includes lines 129. In at least some embodiments, the lines 129 include electronic rack liquid lines, power lines, or both the power lines and the fluid lines to connect to corresponding lines 122. The cooling apparatus 121 includes a collector 127 coupled to the lines 122 and a cooler 132. As shown in FIG. 1C, cooler 132 is placed on a top of collector 127. As shown in FIG. 1C, the apparatus 121 includes a channel 126 that connects the extension chassis 124 to the main chassis 123. In at least some embodiments, the extension chassis 124 includes channel 126 to connect to the main chassis 123. As shown in FIGS. 1A and 1B, the cooling apparatus 121 includes one or more sliding channels 131 coupled to the channel 126. As shown in FIG. 1C, the connection ports 125 are connected to the plurality of lines 121 via flexible connectors 142—e.g., hoses, or other flexible connectors. In at least some embodiments, the connection ports 125 are fluid connection ports, power connection ports, or both the fluid connection ports and the power connection ports. The cooling apparatus 121 is integrated on the electronic rack 130. In at least some embodiments, a package (housing) of the cooling apparatus 121 is a top unit (module) on the electronic rack 130.

The cooling apparatuses 101 and 121 are at their respective extended positions, as shown in FIG. 1C. A portion of the cooling apparatus 101 on the extension chassis 104 is extended to overhang outside the electronic rack 110 at a distance d1. A portion of the cooling apparatus 121 on the extension chassis 124 is extended to overhang outside the electronic rack 110 at a distance d2. In at least some embodiments, each of the distance d1 and distance d2 is about a half distance between the racks 110 and 130, so that a containment region 140 is formed. The containment region 140 includes opposing sidewalls that are the outer sidewalls of the electronic racks 110 and 130 and the extended portions of the housings of the cooling apparatuses 101 and 121.

That is, the two extended sides of the cooling apparatuses 101 and 121 form containment region 140. The cooling apparatus 101 is used to provide connections for the rack lines 109 via lines 102 to connection ports 105. The cooling apparatus 121 is used to provide connections for the rack lines 129 via lines 122 to connection ports 125. The cooling apparatuses 101 and 121 are also used to provide containment region 140. The connection ports 105 and 125 may connect to different external sources. In an embodiment, each of the coolers 112 and 132 function as a liquid to air heat exchanger for cooling the hot exhaust air from the rear side of the racks that is contained in the containment region 140. With the containment region, the hot exhaust air is only directed to the coolers 112 and 132, and is cooled before exiting the containment.

In at least some embodiments, main chassis 103 has a first pair of liquid lines, such as two of the lines 102 mounted therein. The first pair of liquid lines include a liquid supply line to distribute a first cooling liquid to an array of electronic racks and a liquid return line to receive the first cooling liquid from the electronic racks, when the main chassis 103 is positioned on top of the electronic racks, such as electronic rack 110. In at least some embodiments, extension chassis 104 is coupled to the main chassis 103. The extension chassis 104 is configured to move relative to the main chassis 103. The extension chassis includes a first pair of external ports e.g., a pair of connection ports 105 coupled to the first pair of liquid lines respectively. The first pair of external ports can be coupled to a first external cooling source to receive and return the cooling liquid. The extension chassis 104 is capable of being extended horizontally from within the main chassis 103 beyond a physical dimension of the electronic racks, such as electronic rack 110, while the main chassis 103 and the pair of liquid lines 102 are fixedly mounted on the top of the electronic racks. In at least some embodiments, the main chassis 103 and the extension chassis 104 are prefabricated as an integrated unit that can be mounted on top of the electronic racks arranged in a row. In at least some embodiments, the extension chassis includes a second pair of external ports to be coupled to a second cooling source to receive a second cooling liquid. A cooler 112 is coupled to the second pair of external ports to provide cooling to an air space underneath the extension chassis 104 using the second cooling liquid when the extension chassis 104 is extended from the main chassis 103. In at least some embodiments, a collector 107 is used to collect some of the first cooling liquid that has been condensed by the cooler 112 from vapor. In at least some embodiments, the cooler is an air-to-liquid heat exchanger. In at least some embodiments, a second pair of liquid lines is disposed within the main chassis 103. In at least some embodiments, the first pair of liquid lines is configured to distribute a single-phase coolant and the second pair of liquid lines is configured to distribute a two-phase coolant. In at least some embodiments, the first pair of liquid lines are coupled to rack manifolds of the electronic racks via respective flexible hoses.

Figures 2A, 2B:
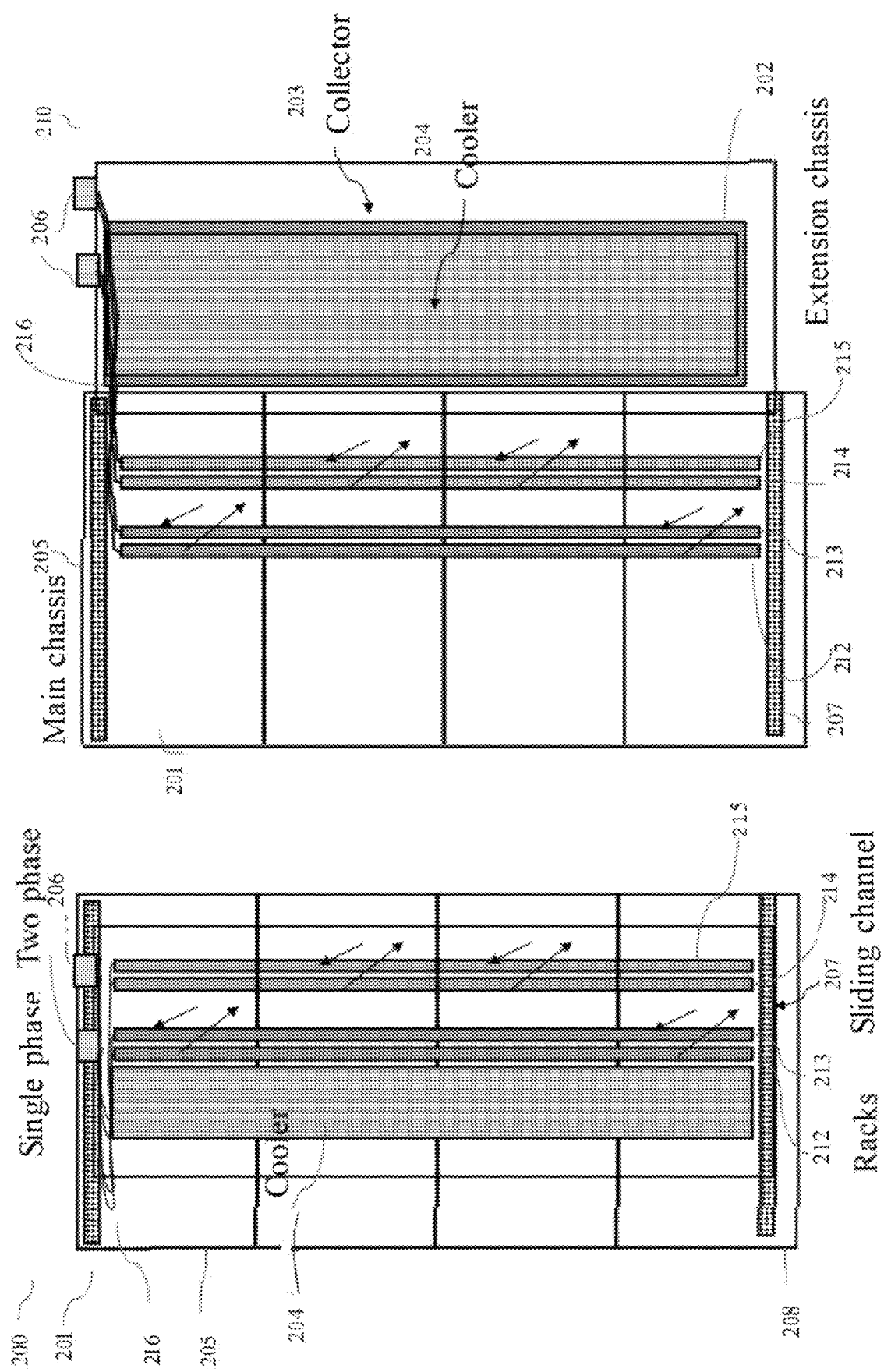
FIG. 2A shows a top view of a cooling apparatus on an electronic rack according to one embodiment.
FIG. 2B shows a top view of a cooling apparatus on an electronic rack according to one embodiment.

FIG. 2A shows a top view 200 of a cooling apparatus 201 on an electronic rack 208 according to one embodiment. The view 200 illustrates a non-extended status of the cooling apparatus 201. FIG. 2B shows a top view 210 of a cooling apparatus 201 on an electronic rack 208 according to one embodiment. The view 210 illustrates an extended status of the cooling apparatus 201. The view 210 is different from view 200 in that the extension chassis of the cooling apparatus 201 is moved relative to the main chassis that remains fixed on the rack 208. As shown in FIGS. 2A and 2B, cooling apparatus 201 includes a cooler 204, a collector 203, fluid lines 212, 213, 214, 215, a main chassis 205, an extension chassis 202; a sliding channel 207, and fluid connection ports 206. As shown in FIGS. 2A and 2B, the fluid lines 212, 213, 214, 215 are coupled to the collector 203 and the main chassis 205. In at least some embodiments, the fluid lines 212, 213, 214, 215 are within the main chassis 205 that is fixed on the rack 208. The extension chassis 202 is movable relative to the main chassis 205 that is fixed on the rack 208. The fluid connection ports 206 are on the extension chassis 202. The connection ports 206 provide connections between the lines 212, 213, 214, 215 and one or more external sources. The connection ports 206 are connected with the lines 212, 213, 214, 215 via flexible connectors 216—e.g., hoses, or other flexible connectors. As shown in FIG. 2B, the extension chassis 202 with connection ports 206 thereon is moved outside the rack 208, while the main chassis 205 including the plurality of lines fluid lines 212, 213, 214, 215 remains fixed on the rack 208. In at least some embodiments, the cooling apparatus 201 is a pre-fabricated module that is installed on the electronic rack. In at least some embodiments, the lines 212 and 213 are single phase fluid lines and lines 214 and 215 are two phase fluid lines. In at least some embodiments, each of the lines 213 and 215 is a supply line and each of the lines 212 and 214 is a return line.

Figure 3A:
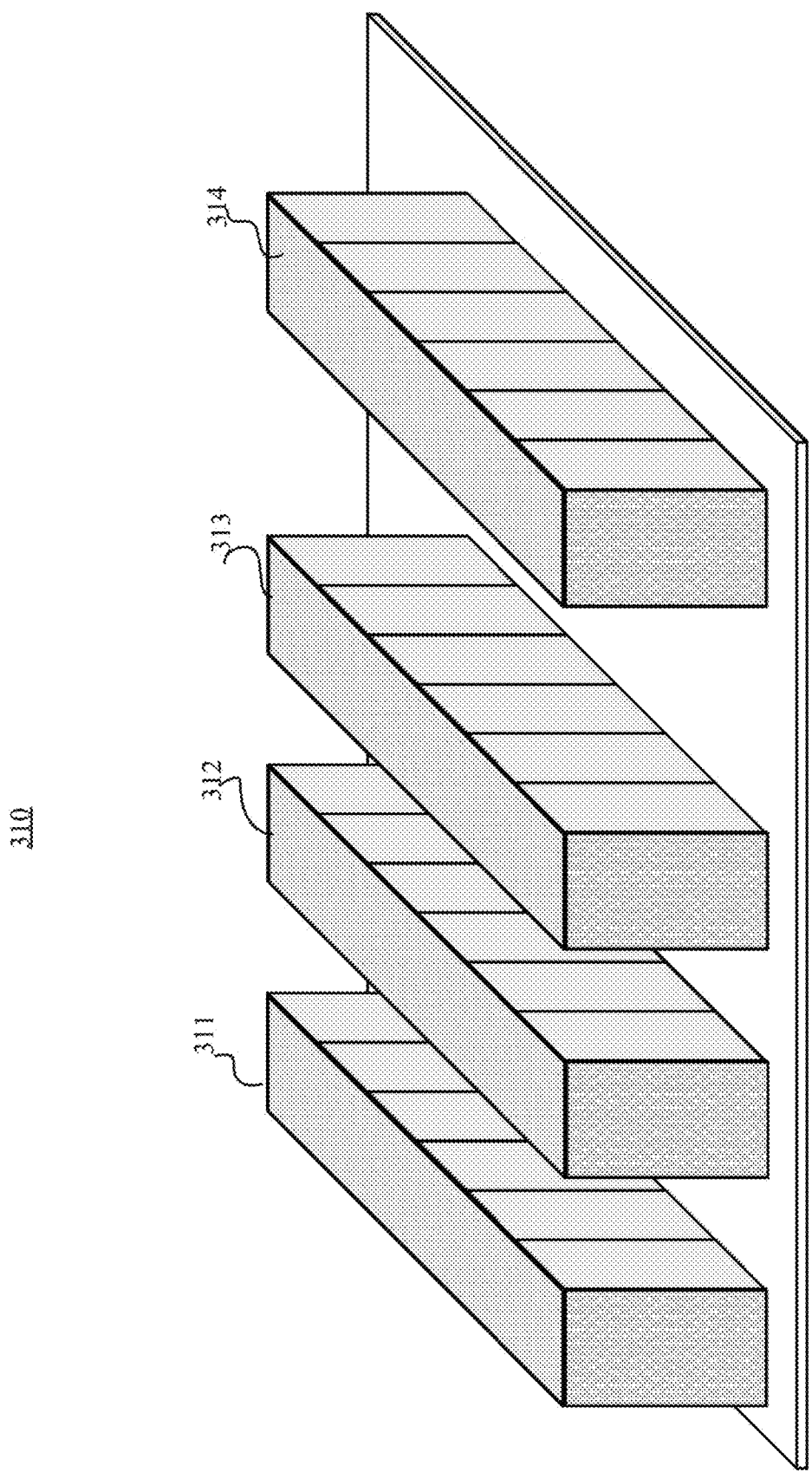
FIG. 3A is a block diagram illustrating a perspective view of at least a portion of a data center including IT clusters according to one embodiment.

FIG. 3A is a block diagram illustrating a perspective view of at least a portion of a data center 310 including IT clusters according to one embodiment. As shown in FIG. 3A, data center 310 includes rows 311, 312, 313 and 314 of clusters of electronic racks of information technology (IT) components, for example, computer servers or computing nodes that are spaced apart by aisles.

Figure 3B:
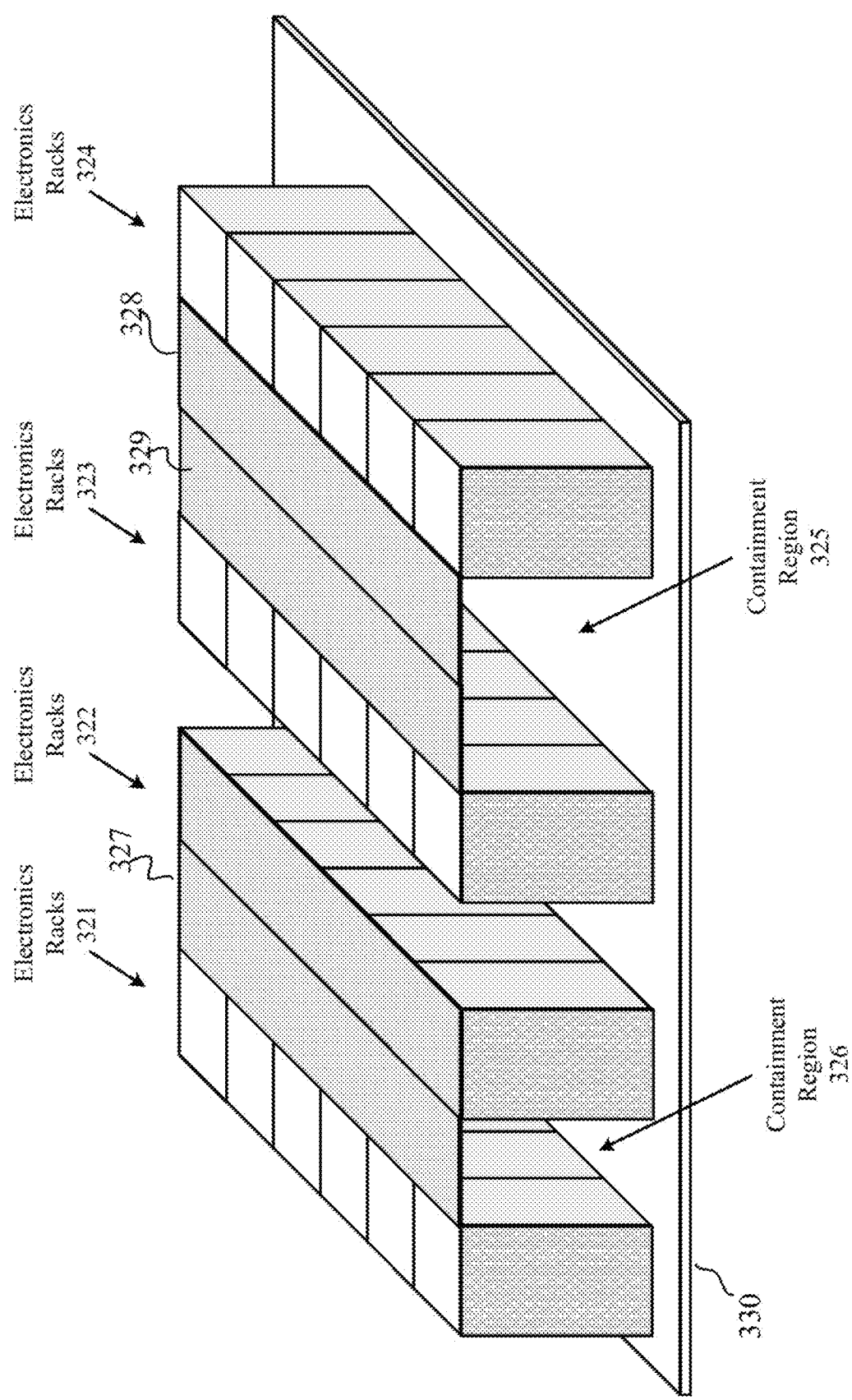
FIG. 3B is a block diagram illustrating a perspective view of at least a portion of a data center including IT clusters according to one embodiment.

FIG. 3B is a block diagram illustrating a perspective view of at least a portion of a data center 320 including IT clusters according to one embodiment. As shown in FIG. 3B, a cluster of electronic racks 321 and a cluster of electronic racks 322 are arranged in rows that are spaced apart by an aisle. A cooling device (apparatus) 327 is placed on a top of electronic racks 321. In at least one embodiment, the cooling apparatus 327 includes a plurality of lines, a main chassis that is coupled to the plurality of lines and an extension chassis that is coupled to the main chassis. In at least some embodiments, the plurality of lines comprise fluid lines, power lines, or both the power lines and the fluid lines to connect to corresponding lines of the electronic rack. The main chassis is configured to be fixed on the electronic rack. The extension chassis is configured to move relative to the main chassis. A plurality of connection ports are coupled to the extension chassis to provide connections between the electronic rack and one or more external sources. The plurality of connection ports are configured to move relative to the plurality of lines that are at fixed locations on the electronic rack, as described above. As shown in FIG. 3B, the cooling apparatus 327 is extended to a top portion of the electronic racks 321 to form a contained environment (containment region) 326 within the aisle. The containment region 326 is within the opposing sidewalls of the electronic racks 321 and 322, the extended portion of the cooling apparatus 327 and a floor 330. The containment region 326 represents a single side extension environment.

As shown in FIG. 3B, a cluster of electronic racks 323 and a cluster of electronic racks 324 are arranged in rows that are spaced apart by an aisle. A cooling apparatus 329 is placed on a top of electronic racks 323. A cooling device (apparatus) 328 is placed on a top of electronic racks 324. The cooling apparatuses 328 and 329 are extended towards each other to form a containment region 325 within the aisle. The containment region 325 is within the opposing sidewalls of the electronic racks 323 and 324, the extended portions of the cooling apparatuses 328 and 329 and floor 330. The containment region 325 represents a double side extension environment.

Figure 3C:
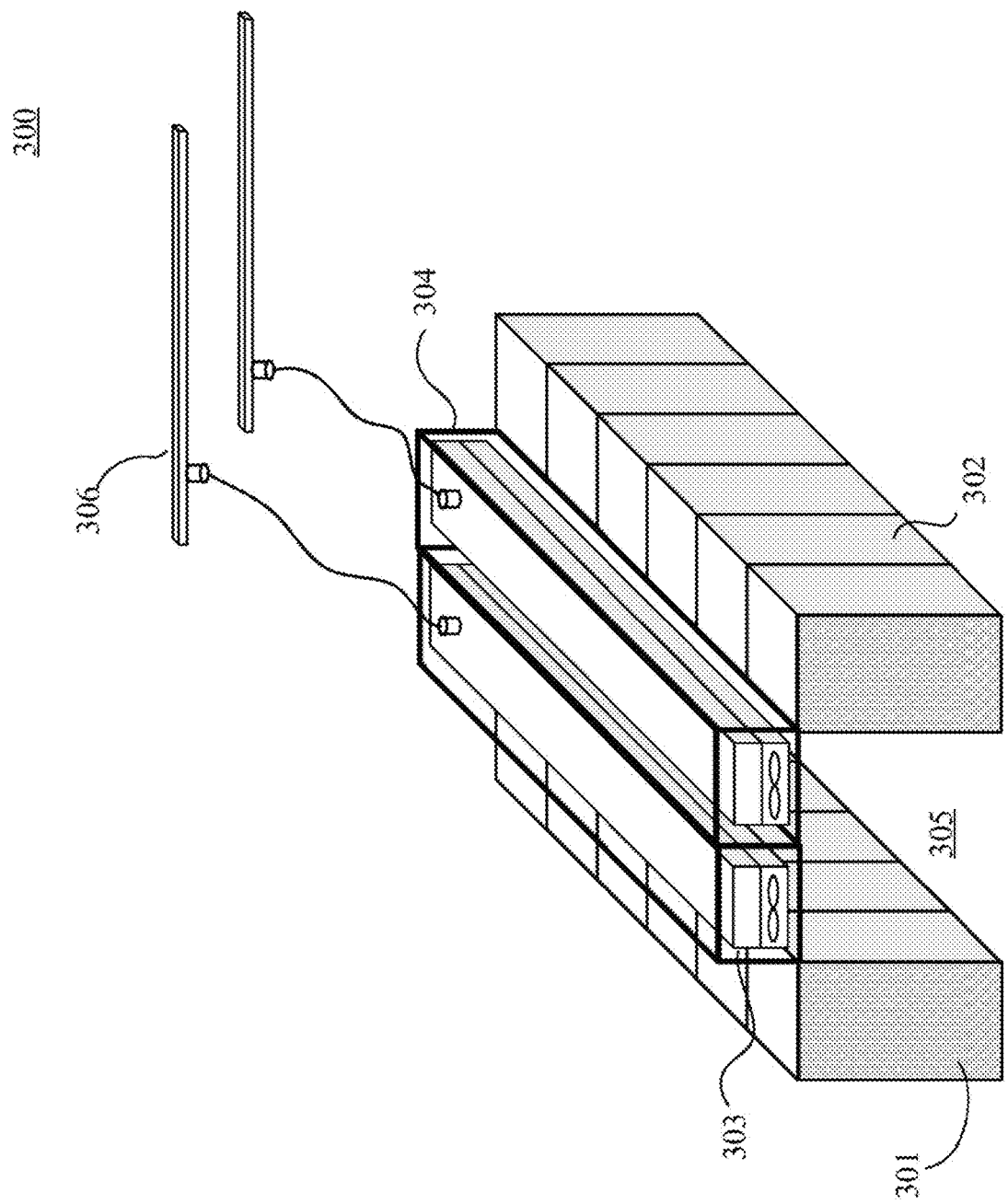
FIG. 3C is a block diagram illustrating a perspective view of at least a portion of a data center including IT clusters according to one embodiment.

FIG. 3C is a block diagram illustrating a perspective view of at least a portion of a data center system 300 including IT clusters according to one embodiment. As shown in FIG. 3C, electronic racks 301 and electronic racks 302 form clusters (e.g., rows) that are spaced apart by an aisle, as described above. A cooling apparatus 303 is placed on a top of the electronic racks 301 and a cooling apparatus 304 is placed on a top of the electronic racks 302. In at least some embodiments, a package (housing) of the cooling apparatus 303 is a top unit on a cluster of electronic racks 301. In at least some embodiments, a package (housing) of the cooling apparatus 304 is a top unit on a cluster of electronic racks 302. The cooling apparatuses 303 and 304 are connected to a data center coolant distribution system 306, as shown in FIG. 3C. The cooling apparatuses 303 and 304 are extended across an aisle 305 toward each other to form a cold containment region in aisle 305, as described in above.

Each of the cooling apparatus 303 and cooling apparatus 304 includes a main chassis having a first pair of liquid lines mounted therein, including a first liquid supply line to distribute first cooling liquid to corresponding electronic racks and a first liquid return line to receive the first cooling liquid from the corresponding electronic racks, and an extension chassis coupled to the main chassis that is configured to move relative to the main chassis, the extension chassis including a first pair of external ports coupled to the first pair of liquid lines respectively, wherein the first pair of external ports can be coupled to a first external cooling source to receive and return the first cooling liquid, wherein the extension chassis is capable of being extended horizontally from within the main chassis towards a center if the aisle to form a containment aisle, while the main chassis and the first pair of liquid lines are fixedly mounted on the top of the corresponding electronic racks, as described above.

Figure 4A:
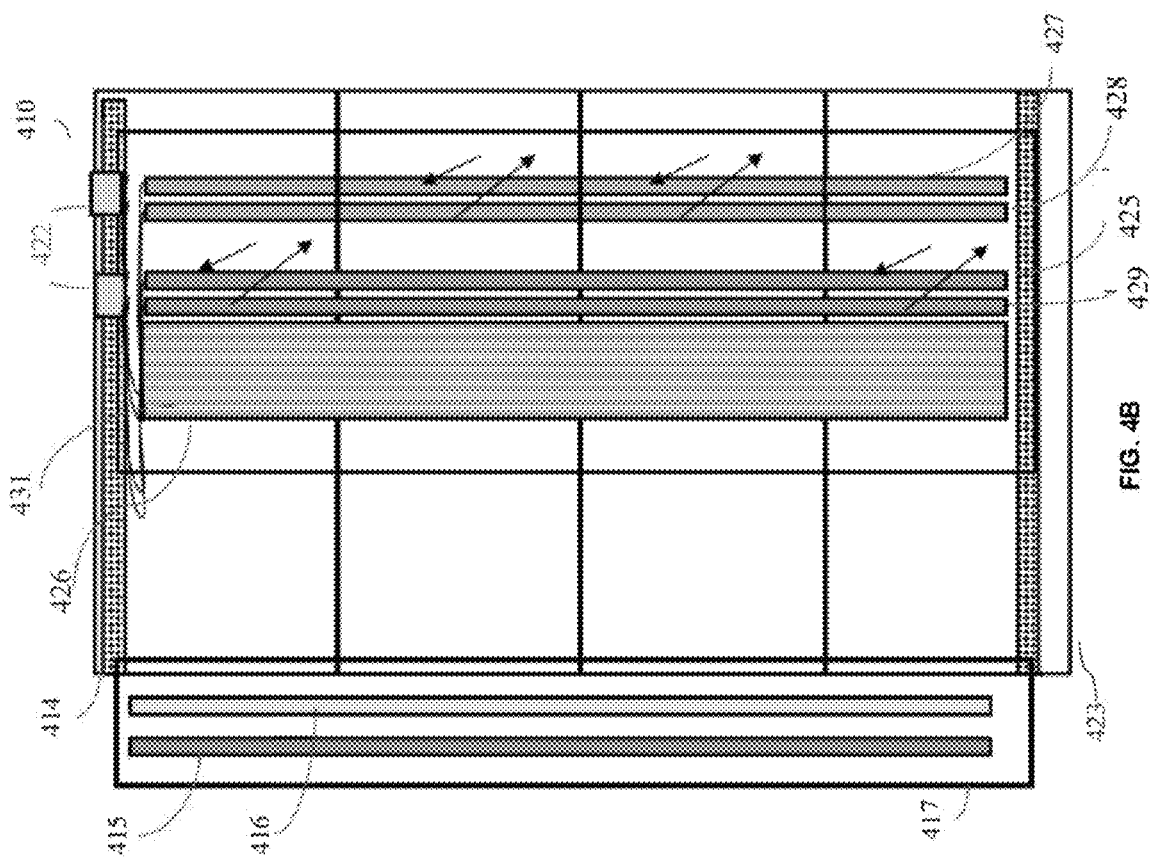
FIG. 4A shows a top view of a cooling apparatus on an electronic rack according to one embodiment.

FIG. 4A shows a top view of a cooling apparatus 400 on an electronic rack 413 according to one embodiment. In at least some embodiments, cooling apparatus 400 represents one of the cooling apparatuses as described above. As shown in FIG. 4A, cooling apparatus 400 includes a main chassis 401, an extension chassis 402, a power bus including power lines 403, 404, fluid lines 405, 409, 407, 408, a cooler 411, a collector 406, and connection ports 412. As shown in FIG. 4A, the fluid lines 405, 409, 407, 408 are coupled to the collector 406. In at least some embodiments, the lines 405 and 409 are single phase fluid lines and lines 407 and 408 are two phase fluid lines. In at least some embodiments, each of the lines 405 and 407 is a supply line and each of the lines 408 and 409 is a return line.

As shown in FIG. 4A, power lines 403, 404 and fluid lines 405, 409, 407, 408 are within the main chassis 401 that is fixed on a top of the rack 413. The extension chassis 402 is movable relative to the main chassis 401 that is fixed on the rack 413. The connection ports 412 are on the extension chassis 402. In at least some embodiments, the connection ports 412 are power connection ports coupled between the power lines 403 and 404 and one or more external power sources. In at least some embodiments, the connection ports 412 are fluid connection ports coupled between the fluid lines 405, 409, 407, 408 and one or more external fluid sources.

As shown in FIG. 4A, the power bus including lines 403 and 404 is packaged within the main chassis 401 that is fixed on the rack 413. The power connection ports 412 are connected with the power lines 403 and 404 via flexible connectors (not shown) that are extended when the power connection ports 412 on extension chassis 402 are moved outside the rack 413 while the main chassis 401 including the power lines 403 and 404 and fluid lines 405, 409, 407, 408 remains fixed on the rack 413. In at least some embodiments, the cooling apparatus 401 is a pre-fabricated module that is installed on the electronic rack.

Figure 4B:
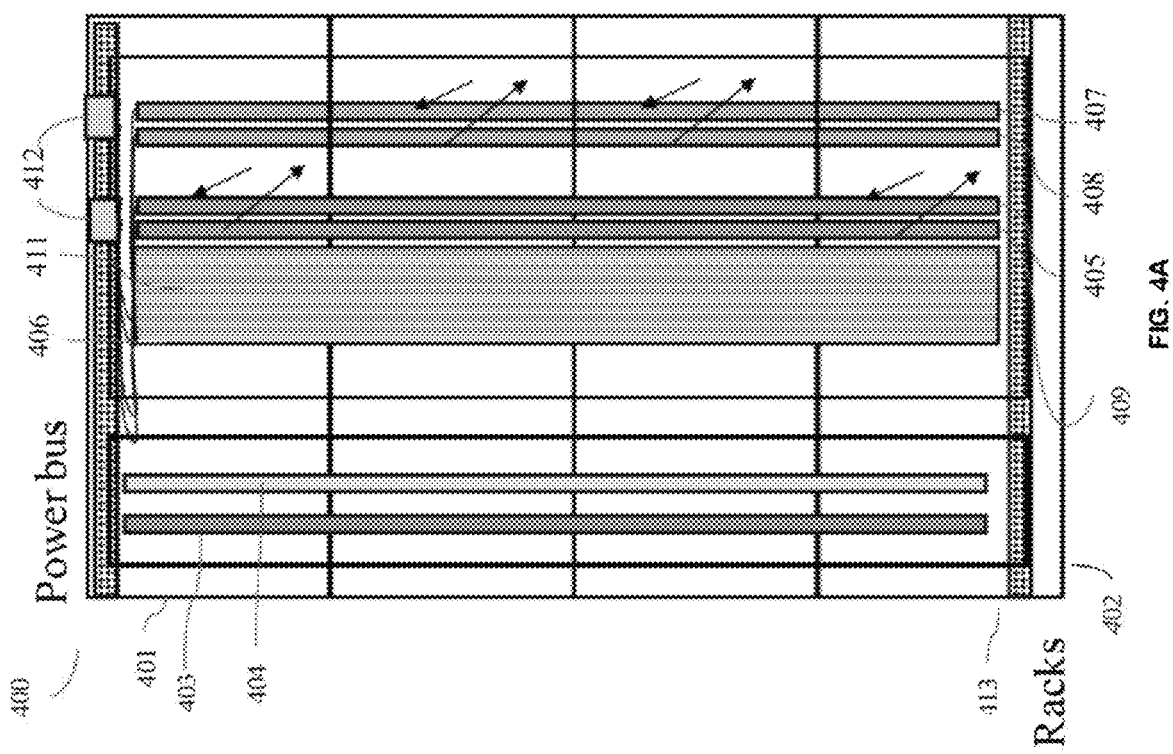
FIG. 4B shows a top view of a cooling apparatus on an electronic rack according to another embodiment.

FIG. 4B shows a top view of a cooling apparatus 410 on an electronic rack 423 according to another embodiment. In at least some embodiments, cooling apparatus 410 represents one of cooling apparatuses 303 and 304, or other cooling apparatus as described herein. As shown in FIG. 4B, cooling apparatus 410 includes a main chassis 414, an extension chassis 417, a power bus including power lines 415, 416, fluid lines 425, 429, 427, 428, a cooler 431, a collector 426, and connection ports 422. In at least some embodiments, the connection ports 422 are fluid connection ports coupled between the fluid lines 425, 429, 427, 428 and one or more external fluid sources. As shown in FIG. 4B, the fluid lines 425, 429, 427, 428 are coupled to the collector 426. In at least some embodiments, the lines 425 and 429 are single phase fluid lines and lines 427 and 428 are two phase fluid lines. In at least some embodiments, each of the lines 425 and 427 is a supply line and each of the lines 428 and 429 is a return line, as described above.

An embodiment illustrated in FIG. 4B is different from an embodiment illustrated in FIG. 4A, in that the power lines 415 and 416 are within the extension chassis 417. As shown in FIG. 4B fluid lines 425, 429, 427, 428 are within the main chassis 414 that is fixed on a top of the rack 423. The extension chassis 417 including power lines 415 and 416 is movable relative to the main chassis 414 that is fixed on the rack 423. In at least some embodiments, the power connection ports (not shown) coupled between the power lines 403 and 404 and one or more external power sources are on the extension chassis 417. As shown in FIG. 4B, the power bus including power lines 415 and 416 is packaged within the extensible chassis. In at least some embodiments, the cooling apparatus 410 is a pre-fabricated module that is installed on the electronic rack.

FIG. 5A shows a top view 500 of an apparatus 501 on an electronic rack 503 according to one embodiment. FIG. 5B shows a top view 510 of an apparatus 501 on an electronic rack 503 according to one embodiment. The view 510 is different from view 500 in that an extension chassis 508 of the apparatus 501 is moved relative to a main chassis 507 that remains fixed on the rack 503. In at least some embodiments, apparatus 501 represents one of cooling apparatuses 303 and 304, or other cooling apparatus as described herein. As shown in FIGS. 5A and 5B, the apparatus 501 includes main chassis 507 including lines 504 and 505 that is fixed on the electronic rack 503 and extension chassis 508 that is moved outside of the rack 503. In at least some embodiments, lines 504 and 505 are fluid lines that are coupled to a collector and a cooler, as described above. In at least some other embodiments, lines 504 and 505 are power lines. In at least some other embodiments, lines 504 and 505 represent power lines and fluid lines. As shown in FIGS. 5A and 5B, connection ports 502 are within the extension chassis 508 to provide connections, via flexible connectors 506, between lines 504 and 505 that are at fixed positions on the electronic rack 503 and one or more external sources. As only the connection ports 502 are movable outside the rack 503, the apparatus 501 is more compact comparing to apparatus 501 described with respect to FIGS. 2A and 2B.

Figure 6:
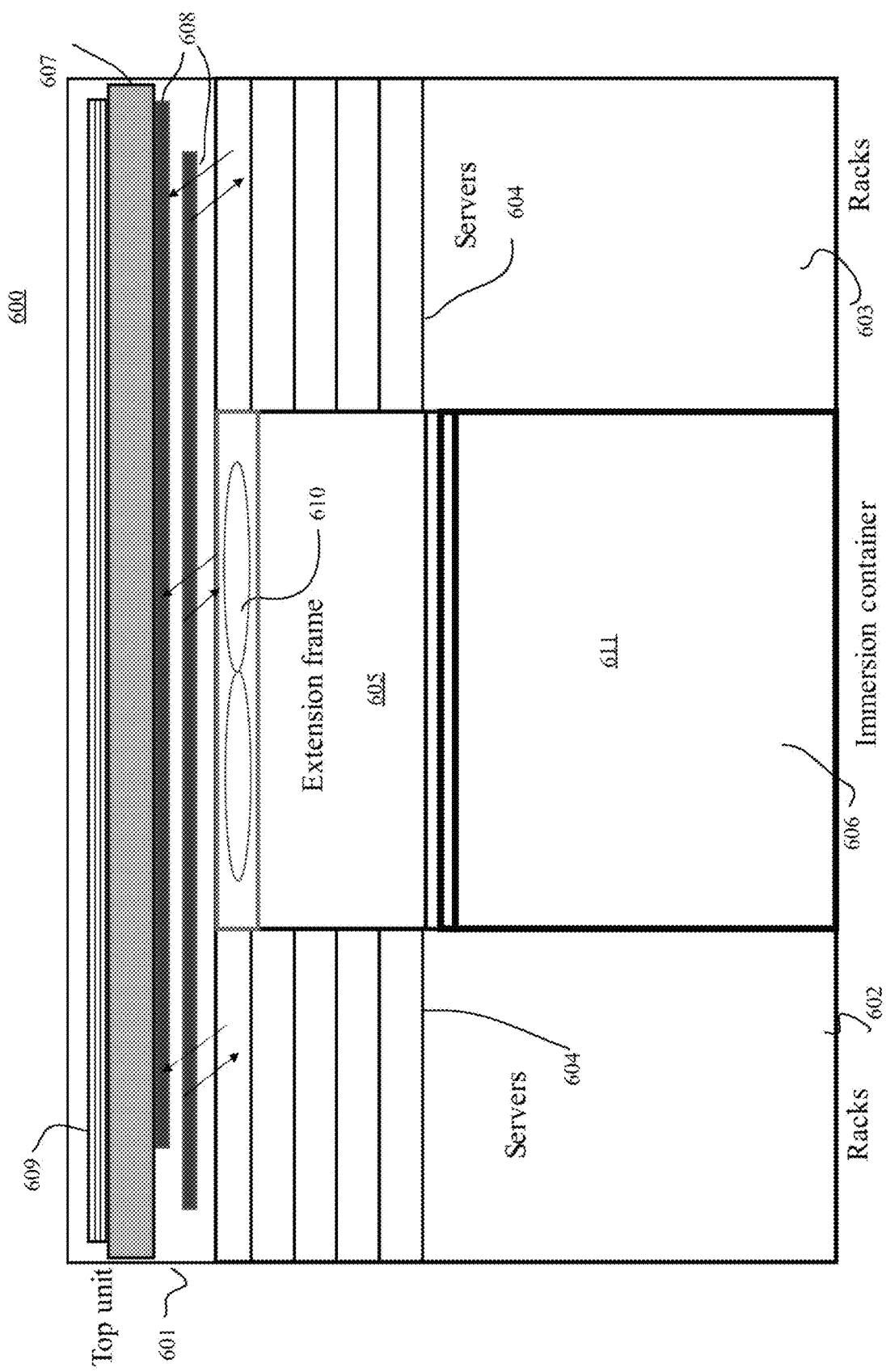
FIG. 6 is a view of a heterogeneous IT cluster according to one embodiment.

FIG. 6 is a front view 600 of a heterogeneous IT cluster according to one embodiment. The front view can be understood as one standing in the aisle facing the IT systems. The heterogeneous IT cluster includes an electronic rack 602, an electronic rack 603 and an immersion container 606 between the racks 602 and 603. As shown in FIG. 6, a cooling apparatus 601 is placed on at least a portion of the electronic rack 602, the electronic rack 603 and the immersion container 606. In one embodiment, the cooling apparatus 601 is placed on a top of the entire heterogeneous IT cluster. The electronic racks 602 and 603 include server chassis 604 including IT components (e.g., electronic devices such as processors, memory, and/or storage devices), as described above. The immersion container 606 contains an immersion cooling liquid 611, as described above. The electronic devices of the corresponding server(s) (not shown) are at least partially submerged into the immersion cooling liquid 611. The immersion cooling liquid 611 may be a dielectric cooling fluid that is circulated between the immersion container 606 and cooling apparatus 601. The vapor flows upstream via the vapor line from the corresponding server chassis to the cooling apparatus 601.

As shown in FIG. 6, an extension frame 605 is on the immersion container 606. The extension frame 605 is designed for vapor management between the immersion container 606 and the cooling apparatus 601. The extension frame 605 functions to guide the vapor flow to a cooler 609 to be condensed. As shown in FIG. 6, one or more fans 610 are coupled to the extension frame 605 to guide the vapor flow to cooler 609. In at least some embodiments, the height of the extension frame 605 is adjusted to match to a difference between the height of the rack 602 and the height of the immersion container 606. For a non-limiting example, the height of the immersion container 606 is about 1.5 meters (m), the height of the rack 602 is about 2.0 m, and the height of the extension frame is adjusted to be about 0.5 m. As shown in FIG. 6, the cooling apparatus includes a fluid distribution module 607. In at least some embodiments, fluid distribution module 607 represents a main chassis 716 including a plurality of fluid lines, as described in further detail below with respect to FIG. 7.

As shown in FIG. 6, cooling apparatus 601 includes one or more lines 608 to receive warmer liquid/air from the racks 602, 603 and/or immersion container 606. The cooling apparatus 601 includes cooler 609 to cool the warmer liquid/air and a collector 609 coupled to the cooler to condense the vapor back to the liquid, where the cooling liquid is then supplied back to the server chassis via return lines 606. In one embodiment, cooling apparatus 601 represents at least a portion of the cooling apparatuses as described above. In one embodiment, cooling apparatus 601 includes a main chassis that is coupled to the lines 606 and 608 and is fixed on the electronic rack, as described above. In one embodiment, cooling apparatus 601 includes an extension chassis that is coupled to the main chassis that is moved relative to the main chassis, and a plurality of connection ports coupled to the extension chassis to provide connections between the electronic rack and one or more external sources, as described above.

Figure 7:
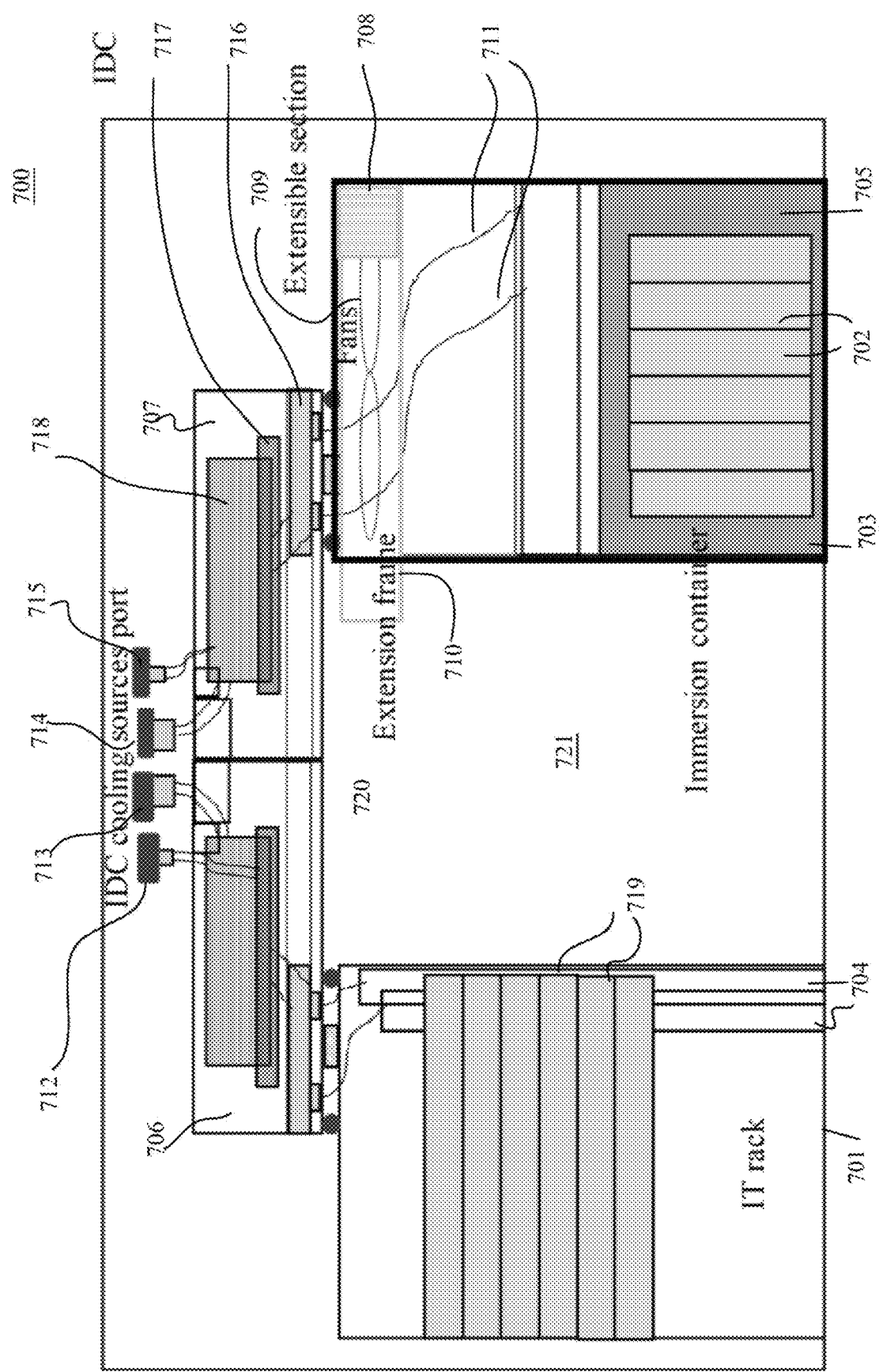
FIG. 7 shows a view of a heterogeneous data center system according to one embodiment.

FIG. 7 shows a view 700 of a heterogeneous data center system according to one embodiment. The heterogeneous system includes an electronic rack 701 that includes server chassis 719 including IT components and an electronic rack 703 that includes an immersion container 705 containing a cooling liquid to submerge the server chassis 702, as described above. A cooling device 706 is on electronic rack 701. The electronic rack 701 includes lines 704—such as electronic rack liquid lines, power lines, or both the power lines and the fluid lines—to connect to corresponding lines of the cooling device 706, as described above. In at least some embodiments, cooling device 707 represents one of the cooling devices as described above.

As shown in FIG. 7, a cooling device 707 is placed on an extension frame 710 of the immersion container 705. As shown in FIG. 7, extension frame 710 includes one or more fans 709 and an extensible section 708. The one or more fans 709 are used to guide the vapor flow to cooling device 707, as described above. As shown in FIG. 7, the extension frame 710 is built on top of the immersion container 705 and is integrated with the fans 709. The fans 709 are packaged with the extensible section 708 that is extended outside the rack 703, as shown in FIG. 7. In at least some embodiments, extension frame 710 represents at least a portion of the extension frame 605.

As shown in FIG. 7, the cooling device 707 comprises a cooler 717 on a collector 717, a main chassis 716 including a plurality of lines fixed on the extension frame 710. An extension chassis 720 is coupled to the main chassis 716. Extension chassis 720 is configured to move relative to the main chassis 716, as described above. One or more connection ports, such as internet data center (IDC) cooling sources ports 712, 713, 714 and 715 are coupled to the extension chassis of the electronic rack to provide fluid connections between the electronic racks and one or more external sources, as described above. In at least some embodiments, cooling device 707 represents one of the cooling devices as described above.

As shown in FIG. 7, the cooler 718 and collector 717 are within the extension chassis 720 and extend outside the electronic rack 703. As shown in FIG. 7, the cooler and the collector that are within the extension chassis of the cooling device 706 are extended to connect to the extension chassis 720 of the cooling device 706, so that a containment region (space) 721 in an aisle is formed. As shown in FIG. 7, the extensible section 708 is extended outside the rack containing the immersion container 705 to assist vapor flowing to cooler 718 of the cooling device 707. In at least some embodiments, the connection ports of the cooling device 707 are moved relative to the plurality of lines within the main chassis 716 that are at fixed locations on the electronic rack 703. In at least some embodiments, the IDC system is simplified with only the space 721 and the cooling sources ports, such as cooling source ports 712, 713, 714 and 715. The IDC system as shown in FIG. 7 can be beneficially used for deploying different types of IT system such as the IT rack and the immersion container.

Figure 8:
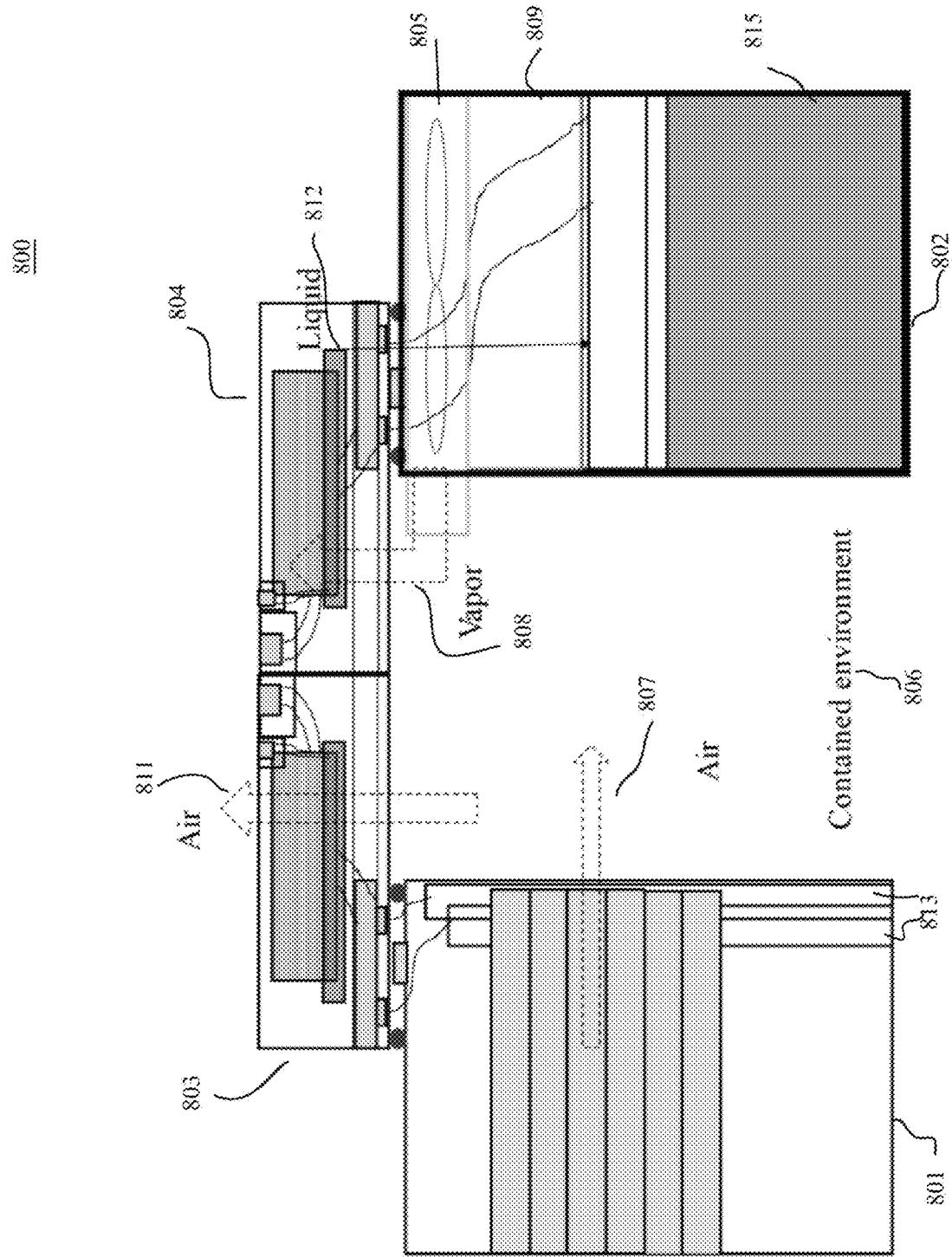
FIG. 8 shows a view of a heterogeneous data center system according to one embodiment.

FIG. 8 shows a view 800 of a heterogeneous IDC system according to one embodiment. The heterogeneous system includes an electronic rack 801 that includes the server chassis including the IT components and an electronic rack 802 that includes an immersion container 815 containing a cooling liquid to submerge the server chassis, as described above. A cooling device 803 is on electronic rack 801 that includes lines 813, as described above. As shown in FIG. 8, a cooling device 804 is on an extension frame 809 of the immersion container 815. As shown in FIG. 8, extension frame 809 includes an extensible section 805 that includes one or more fans to extend outside the rack 802 and guide a vapor flow 808 to cooling device 804. In at least some embodiments, extension frame 809 represents at least a portion of one of the extension frames described above.

As shown in FIG. 8, the cooling device 804 is fixed on the extension frame 809. In at least some embodiments, the cooling device 804 represents the cooling device 907. As shown in FIG. 8, the extension chassis including the cooler and the connector of each of the cooling devices 803 and 804 are extended to connect to each other that forms a containment region 806. As shown in FIG. 8, containment region 806 includes different types of gas flows, e.g., an airflow 807 that moves from the rack 801 towards the collector and cooler 811 of the cooling device 803 and a vapor flow 808 that is moved by the fans of the extensible section 805 towards the cooler and the collector of the cooling device 804 to condense to a liquid 812. The system provides different types of gases in a containment region in a heterogeneous cluster. The coolers of the cooling devices are beneficially used in different types of functions of cooling the airflow, the vapor, or both the airflow and the vapor. With the variations in the cooling device, the design is flexible for building and developing different types of modules for configuring different types of heterogeneous clusters.

Embodiments of the cooling systems and apparatuses described herein provide various configurations for IT clusters and the servers. Embodiments of the cooling systems and apparatuses described herein can be beneficially integrated with different fluid systems. Embodiments of the cooling systems and apparatuses described herein can be used for designing different heterogeneous clusters, as described above. Embodiments of the cooling systems and apparatuses described herein provide the hardware infrastructure capability, service quality and availability while reducing the cost. A robust system architecture, control and operation as described herein benefit the service providers in multiple aspects in a long term. Embodiments of the cooling systems and apparatuses described herein provide high resilience and flexible configurations to accommodate dynamic variations in software, application and business requirements, and at the same time decrease cost.

Figure 9:
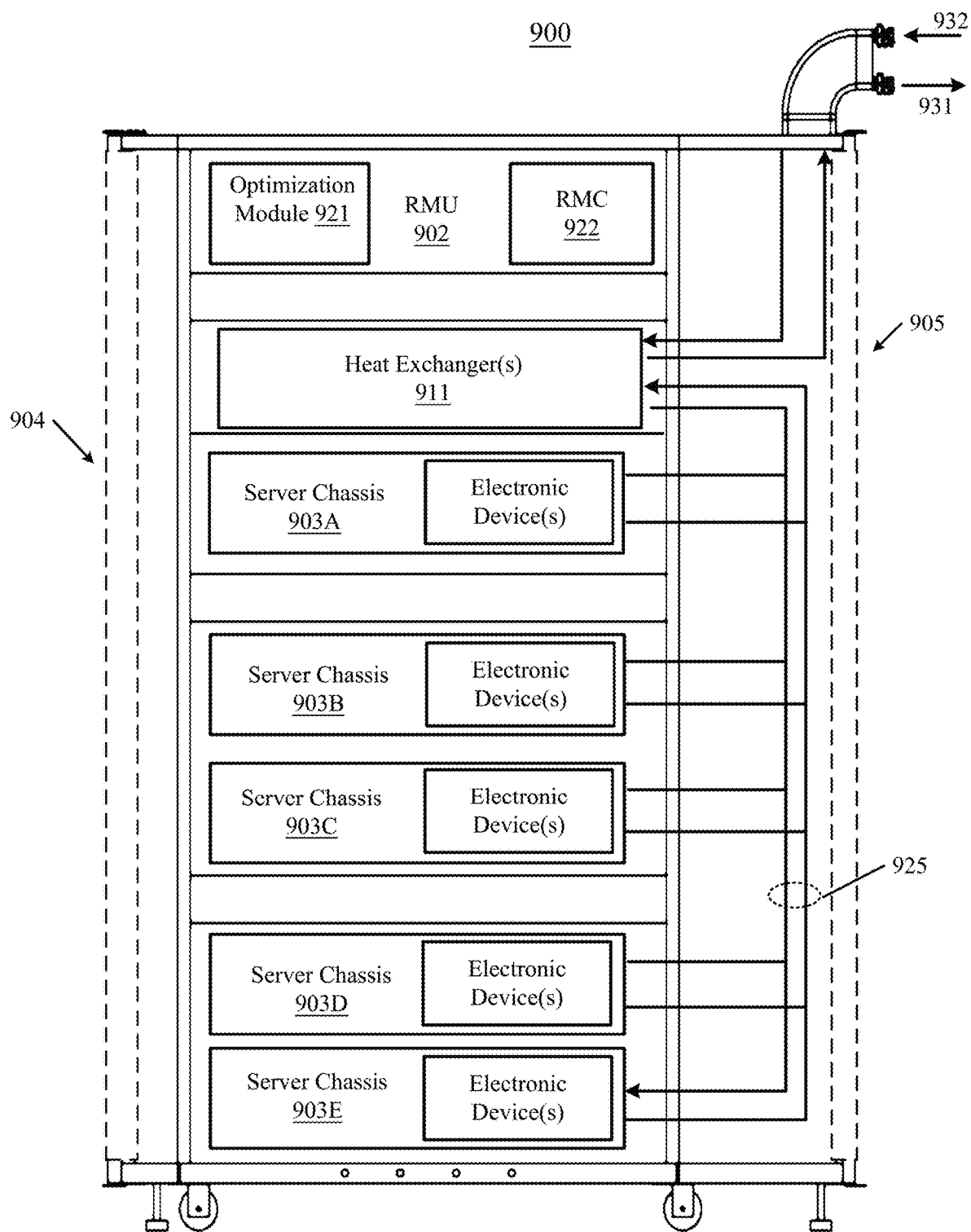
FIG. 9 is a block diagram illustrating an electronic rack according to one embodiment.

FIG. 9 is a block diagram illustrating an electronic rack 900 according to one embodiment. An electronic rack 900 may represent any of the electronic racks as described throughout the disclosure. According to one embodiment, electronic rack 900 includes, but is not limited to, a heat exchanger 911, a rack management unit (RMU) 902, and one or more server chassis 903A-903E (collectively referred to as server chassis 903). Server chassis 903 can be inserted into an array of server slots (e.g., standard shelves) respectively from a frontend 904 or a backend 905 of electronic rack 900. Note that although there are five server chassis 903A-903E shown here, more or fewer server chassis may be maintained within electronic rack 900. Also note that the particular positions of heat exchanger 911, RMU 902, and/or server chassis 903 are shown for the purpose of illustration only; other arrangements or configurations of heat exchanger 911, RMU 902, and/or server chassis 903 may also be implemented. In one embodiment, electronic rack 900 can be either open to the environment or partially contained by a rack container, as long as the cooling fans can generate airflows from the frontend to the backend. In at least some embodiments, the cooling apparatus as described in the application is designed to be integrated or directly packaged on top of the rack. In at least some embodiments, the external liquid (fluid) supply/return lines 931-932 are connected with the cooling apparatus.

In addition, for at least some of the server chassis 903, an optional fan module (not shown) is associated with the server chassis. Each of the fan modules includes one or more cooling fans. The fan modules may be mounted on the backends of server chassis 903 or on the electronic rack to generate airflows flowing from frontend 904, traveling through the air space of the sever chassis 903, and exiting at backend 905 of electronic rack 900.

In at least some embodiments, a cooling apparatus (not shown) is coupled to the electronic rack 900, as described in further detail below. In one embodiment, heat exchanger 911 may be a liquid-to-liquid heat exchanger. Heat exchanger 911 includes a first loop with inlet and outlet ports having a first pair of liquid (fluid) connectors coupled to external liquid (fluid) supply/return lines 931-932 to form a primary loop. The connectors coupled to the external liquid supply/return lines 931-932 may be disposed or mounted on backend 905 of electronic rack 900. The liquid supply/return lines 931-932, also referred to as room liquid supply/return lines, may be coupled to an external cooling system. In one embodiment, heat exchanger 911 is used to cool the air/vapor using the coolant received from an external source.

In addition, heat exchanger 911 further includes a second loop with two ports having a second pair of liquid connectors coupled to rack manifold 925 to form a secondary loop, which may include a supply manifold (also referred to as a rack liquid supply line or rack supply manifold) to supply cooling liquid to server chassis 903 and a return manifold (also referred to as a rack liquid return line or rack return manifold) to return warmer liquid back to heat exchanger 911. Note that heat exchanger 911 can be any kind of heat exchangers commercially available or customized ones. Thus, the details of heat exchanger 911 will not be described herein.

Each of server chassis 903 may include one or more information technology (IT) components (e.g., electronic devices such as processors, memory, and/or storage devices). In one embodiment, in at least some of the server chassis 903, an electronic device may be attached to a cold plate. The cold plate includes a liquid distribution channel to receive cooling liquid from the rack liquid supply line of rack manifold 925. The cooling liquid performs heat exchange from the heat generated from the electronic device attached thereon. The cooling liquid carrying the exchanged heat is returned to the rack liquid return line of rack manifold 925 and back to heat exchangers 911.

In another embodiment, some of the server chassis 903 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 911. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 911. Heat exchanger 911 may include a condenser to condense the vapor from the vapor form back to the liquid form, where the cooling liquid is then supplied back to the server chassis.

Note that some of the server chassis 903 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 925 may include a first rack manifold for single-phase cooling and a second rack manifold for two-phase cooling to be coupled to the same or different server chassis for different types of cooling. Some of the sever chassis 903 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 903 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

In at least some embodiments, electronic rack 900 further includes RMU 902 configured to provide and manage power supplied to servers 903 and heat exchanger 911. RMU 902 may be coupled to a power supply unit (not shown) to manage the power consumption of the power supply unit. The power supply unit may include the circuitry (e.g., an alternating current (AC) to direct current (DC) or DC to DC power converter, battery, transformer, or regulator, etc.,) to provide power to at least some of the remaining components of electronic rack 900.

In one embodiment, RMU 902 includes optimization module 921 and rack management controller (RMC) 922. RMC 922 may include a monitor to monitor operating status of various components within electronic rack 900, for example, computing nodes on the server chassis 903, heat exchanger 911, and the fan modules. In at least some embodiments, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 922 configures the liquid pump and cooling fans of the fan modules based on the optimal pump speeds and fan speeds.

Figure 10:
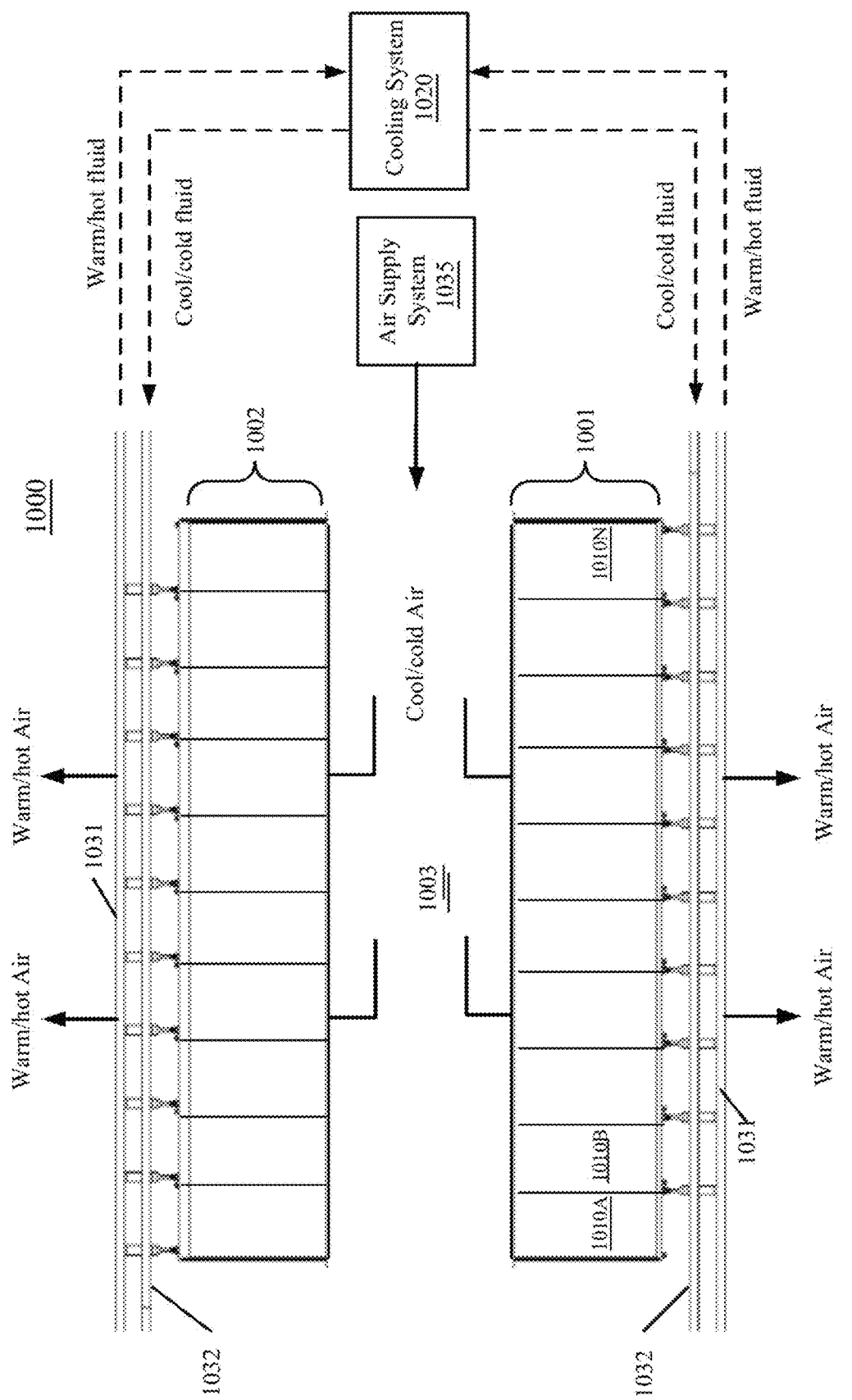
FIG. 10 is a block diagram illustrating a top view of at least a portion of a data center system according to one embodiment.

FIG. 10 is a block diagram illustrating a top view of at least a portion of a data center system 1000 according to one embodiment. As shown in FIG. 10, data center system 1000 includes one or more rows of electronic racks of information technology (IT) components, equipment or instruments 1001-1002, for example, computer servers or computing nodes that provide data services to a variety of clients over a network (e.g., the Internet). In at least some embodiments a cooling apparatus (not shown) is placed on one or more rows 1001-1002 of electronic racks, as described above. In at least some embodiments, data center system 1000 includes at least a portion of data center system 310.

In an embodiment, each row includes an array of electronic racks such as electronic racks 1010A-1010N. However, more or fewer rows of electronic racks may be implemented. Typically, rows 1001-1002 are aligned in parallel with frontends facing towards each other and backends facing away from each other, forming an aisle 1003 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 1010A-1010N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having IT components (e.g., one or more processors, a memory, and/or a storage device), where a computing node may include one or more servers operating therein. Some of the IT components may be configured with regular liquid/air cooling, while others may be configured with immersion cooling. Note that the cooling system 1020 may be coupled to multiple data center systems such as data center system 1000.

In one embodiment, cooling system 1020 includes an external liquid loop connected to a cooling tower or a dry cooler external to the building/housing container. The cooling system 1020 can include, but is not limited to evaporative cooling, free air, rejection to large thermal mass, and waste heat recovery designs. Cooling system 1020 may include or be coupled to a cooling liquid source that provide a cooling liquid.

In one embodiment, the cooling liquid manifold disposed on the backend of each electronic rack is coupled to liquid supply line 932 (also referred to as a room supply manifold) to receive cooling liquid from cooling system 1020. Liquid supply/return lines 931-932 are referred to as data center or room liquid supply/return lines (e.g., global liquid supply/return lines), which supply cooling liquid to all of the electronic racks of rows 1001-1002. The liquid supply line 932 and liquid return line 931 are coupled to a heat exchanger within each of the electronic racks, forming a primary loop. The secondary loop of the heat exchanger is coupled to each of the server chassis in the electronic rack to deliver the cooling liquid to the cooling devices of the IT components therein.

In one embodiment, data center system 1000 further includes an airflow delivery system 1035 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 1035 generates an airflow of cool/cold air to circulate from aisle 1003 through electronic racks 1010A-1010N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An apparatus for an electronic rack of a data center, comprising:
   a first pair of liquid lines;
   a main chassis coupled to the first pair of liquid lines that is configured to be fixed on the top of the electronic rack;
   an extension chassis coupled to the main chassis that is configured to move relative to the main chassis, the extension chassis including a first pair of external ports coupled to the first pair of liquid lines respectively, wherein the first pair of external ports can be coupled to a first external cooling source to receive and return first cooling liquid, wherein the extension chassis further comprises:
  a second pair of external ports to be coupled to a second cooling source through a second pair of liquid lines to receive second cooling liquid; and
  a cooler coupled to the second pair of external ports to provide cooling to an air space underneath the extension chassis using the second cooling liquid when the extension chassis is extended from the main chassis; and wherein the extension chassis is capable of being extended horizontally from within the main chassis beyond a physical dimension of one or more electronic racks, while the main chassis and the first pair of liquid lines are fixedly mounted on the top of the one or more electronic racks or immersion container.

2. The apparatus of claim 1, further comprising:
a collector coupled to the second pair of liquid lines and the cooler.

3. The apparatus of claim 1, further comprising:
a first channel to connect the extension chassis to the main chassis; and
one or more sliding channels coupled to the first channel.

4. The apparatus of claim 1, wherein the first pair of external ports are connected to the first pair of liquid lines via flexible connectors.

5. The apparatus of claim 1, wherein the electronic rack is the immersion cooling container, and wherein the apparatus further comprises:
an extension frame coupled to the immersion cooling container to guide a vapor flow to the cooler; and
one or more fans coupled to the extension frame.

6. The apparatus of claim 1, wherein the first pair of external ports comprise a single phase fluid lines, a two phase fluid lines, or both the single phase fluid lines and the two phase fluid lines.

7. An electronic rack for a data center, comprising:
a server rack;
a main chassis coupled to the server rack, the main chassis having a first pair of liquid lines mounted therein, including a first liquid supply line to distribute first cooling liquid to one or more electronic racks and a first liquid return line to receive the first cooling liquid from the one or more electronic racks, when the main chassis is positioned on top of the electronic racks; and
an extension chassis coupled to the main chassis that is configured to move relative to the main chassis, the extension chassis including a first pair of external ports coupled to the first pair of liquid lines respectively, wherein the first pair of external ports can be coupled to a first external cooling source to receive and return the first cooling liquid, wherein the extension chassis further comprises:
  a second pair of external ports to be coupled to a second cooling source to receive second cooling liquid; and
  a cooler coupled to the second pair of external ports to provide cooling to an air space underneath the extension chassis using the second cooling liquid when the extension chassis is extended from the main chassis, wherein the extension chassis is capable of being extended horizontally from within the main chassis beyond a physical dimension of the electronic racks, while the main chassis and the first pair of liquid lines are fixedly mounted on the top of the one or more electronic racks or immersion container.

8. The electronic rack of claim 7, wherein the main chassis and the extension chassis are designed as an integrated unit that can be mounted on top of the one or more electronic racks.

9. The electronic rack of claim 7, wherein the extension chassis further comprises:
a collector to collect some of the first cooling liquid that has been condensed by the cooler from vapor.

10. The electronic rack of claim 7 further is designed as:
the immersion container;
an extension frame coupled to the extension chassis to guide a vapor flow to the cooler; and
one or more fans coupled to the extension frame.

11. The electronic rack of claim 7, further comprising:
a first channel to connect the extension chassis to the main chassis; and
one or more sliding channels coupled to the first channel to enable the extension chassis to slide in and out from the main chassis.

12. The electronic rack of claim 7, further comprising:
a second pair of liquid lines disposed within the main chassis, wherein the first pair of liquid lines is configured to distribute single-phase coolant and the second pair of liquid lines is configured to distribute two-phase coolant.

13. The electronic rack of claim 7, further comprising:
a plurality of power lines coupled to at least one of the main chassis or the extension chassis; and
a plurality of power connection ports coupled to the plurality of power lines.

14. A data center system, comprising:
a first cluster of electronic racks;
a second cluster of electronic racks positioned in parallel to and spaced apart from the first cluster to form an aisle in between;
a first cooling device disposed on top and across the first cluster of electronic racks; and
a second cooling device disposed on top and across the second cluster of electronic racks, wherein each of the first cooling device and the second cooling device comprises:
  a main chassis having a first pair of liquid lines mounted therein, including a first liquid supply line to distribute first cooling liquid to corresponding electronic racks and a first liquid return line to receive the first cooling liquid from the corresponding electronic racks, and
  an extension chassis coupled to the main chassis that is configured to move relative to the main chassis, the extension chassis including a first pair of external ports coupled to the first pair of liquid lines respectively, wherein the first pair of external ports can be coupled to a first external cooling source to receive and return the first cooling liquid, wherein the extension chassis further comprises:
    a second pair of external ports to be coupled to a second cooling source to receive second cooling liquid; and
    a cooler coupled to the second pair of external ports to provide cooling to an air space underneath the extension chassis using the second cooling liquid when the extension chassis is extended from the main chassis, wherein the extension chassis is capable of being extended horizontally from within the main chassis towards a center if the aisle to form a containment region, while the main chassis and the first pair of liquid lines are fixedly mounted on the top of the corresponding electronic racks.

15. The data center system of claim 14, wherein the main chassis and the extension chassis are prefabricated as an integrated unit that can be mounted on top of the electronic racks arranged in a row.

16. The data center system of claim 14, wherein the extension chassis further comprises:
    a collector to collect some of the first cooling liquid that has been condensed by the cooler from vapor.

17. The data center system of claim 14, wherein at least one of the electronic racks is the immersion cooling container, and wherein the system further comprises:
    an extension frame coupled to the immersion cooling container to guide a vapor flow to the cooler; and
    one or more fans coupled to the extension frame.

18. The data center system of claim 14, wherein each of the first and second cooling devices comprises:
    a first channel to connect the extension chassis to the main chassis; and
    one or more sliding channels coupled to the first channel to enable the extension chassis to slide in and out from the main chassis.

* * * * *